United States Patent [19]
Ohta

[11] Patent Number: 6,070,735
[45] Date of Patent: Jun. 6, 2000

[54] SPUTTERING APPARATUS SIMULATION METHOD

[75] Inventor: Toshiyuki Ohta, Tokyo, Japan

[73] Assignee: NEC Corporation, Tokyo, Japan

[21] Appl. No.: 09/201,143

[22] Filed: Nov. 30, 1998

[30] Foreign Application Priority Data

Nov. 28, 1997 [JP] Japan .................................. 9-328116

[51] Int. Cl.[7] ................................................. C23C 14/34
[52] U.S. Cl. ............................... 209/192.13; 369/469.02; 369/578
[58] Field of Search ......................... 209/298.01, 298.03, 209/192.1, 192.13; 364/469.02, 578

[56] References Cited

U.S. PATENT DOCUMENTS

| 5,751,607 | 5/1998 | Ohta ................................... | 395/500.34 |
| 5,815,684 | 9/1998 | Ohta et al. ........................ | 395/500.35 |
| 5,850,356 | 12/1998 | Yamada et al. .................... | 395/500.27 |

OTHER PUBLICATIONS

H. Yamada et al., "Practical Monte Carlo Sputter Desposition Simulation with Quasi–Axis–Symmetrical (QAS) Approxi–mation," pp. 21.4.1–21.4.4, IEEE, 1994.

Primary Examiner—Nam Nguyen
Assistant Examiner—Julian A. Mercado
Attorney, Agent, or Firm—Young & Thompson

[57] ABSTRACT

Calculation is made of a collision point and a collision time of collision between a sputter particle and a surrounding gas particle (step 102). The collision time is compared with a unit time having a predetermined length (step 104). When the collision time is smaller than the unit time, calculation is made of the temperature distribution of a surrounding gas at the collision point with reference to a result of thermal analysis performed in a preceding unit time (step 105). Then, the energy variation of the surrounding gas particle is calculated by the use of the temperature distribution (steps 106–109). After the calculation is performed for all collision coordinates within the unit time, the temperature distribution of the surrounding gas at the collision point. is obtained by thermal analysis with reference to the result of calculation of the energy variation and the unit time is renewed (steps 111–113).

9 Claims, 2 Drawing Sheets

SPUTTERING APPARATUS SIMULATION METHOD

BACKGROUND OF THE INVENTION

This invention relates to a sputtering apparatus simulation method and, in particular, to a sputtering apparatus simulation method reflecting the influence of temperature rise during sputtering.

As one of conventional sputtering apparatus simulation methods reflecting the influence of temperature rise during sputtering, a simulation method utilizing the Monte Carlo method is known (H. Yamada et. al., 1994, IEDM Tech. Digest, pages 553–556). Referring to FIG. 1, a sputter particle is emitted from a target 11 of a sputtering apparatus, passes through a collimator 12, and reaches a wafer 13. In order to obtain an orbit 14 of the particle, calculation is made of a generating position, an emission angle, and energy of the particle by the use of a random number. Subsequently, with reference to the above-mentioned values, a collision point 16 of the particle emitted from an emission point 15 is calculated assuming the Poisson distribution.

Next, a scattering angle of a sputter particle due to the collision is calculated by rigid-sphere approximation with reference to the result of elastic scattering calculation in the central force field. Herein, it is assumed that velocity distribution of a surrounding gas particle which collides with the sputter particle exhibits the Maxwell distribution. In the above-mentioned manner, the orbit 14 of the sputter particle reaching the wafer 13, which is a silicon substrate, is calculated When the sputtering rate or the surrounding gas pressure is high, the temperature of the surrounding gas increases during the sputtering and the temperature has a nonuniform distribution. However, the conventional simulation method assumes that the temperature of the surrounding gas is constant during the sputtering. Thus, the influence of the temperature rise or the temperature distribution can not be reflected at all.

In order to reflect the above-mentioned influence, use may be made of a direct Monte Carlo method. According to this method, a large number of particles are generated in the sputtering apparatus and calculation is made of the orbit and the collision for each particle. However, the direct Monte Carlo method requires the calculation for such a large number of particles, the calculation time inevitably becomes long.

SUMMARY OF THE INVENTION

In view of the above, it is an object of the present invention to provide a sputtering apparatus simulation method capable of carrying out simulation reflecting the temperature rise in a surrounding gas.

It is another object of the present invention to provide a sputtering apparatus simulation method capable of carrying out simulation reflecting the temperature rise of a surrounding gas without substantial increase in calculation time.

According to this invention, a sputtering apparatus simulation method utilizing the Monte Carlo method comprises a first step of calculating a collision point and a collision time of collision between a sputter particle and a surrounding gas particle; a second step of calculating, for each of all collision coordinates at which collision occurs within a unit time having a predetermined length, energy variation of the surrounding gas particle with reference to the temperature distribution of a surrounding gas at the collision point that is obtained by thermal analysis performed in a preceding unit time; and a third step of obtaining the temperature distribution of the surrounding gas at the collision point by thermal analysis using the result of calculation of the energy variation and thereafter renewing the unit time. Herein, the collision coordinate shows the position where the collision takes place between the sputter particle and the surrounding gas particle.

In the present invention, the temperature rise during sputtering is obtained by the thermal analysis and its influence upon the orbit of the sputter particle can be calculated.

DESCRIPTION OF THE PREFERRED EMBODIMENTS

Figure 1:
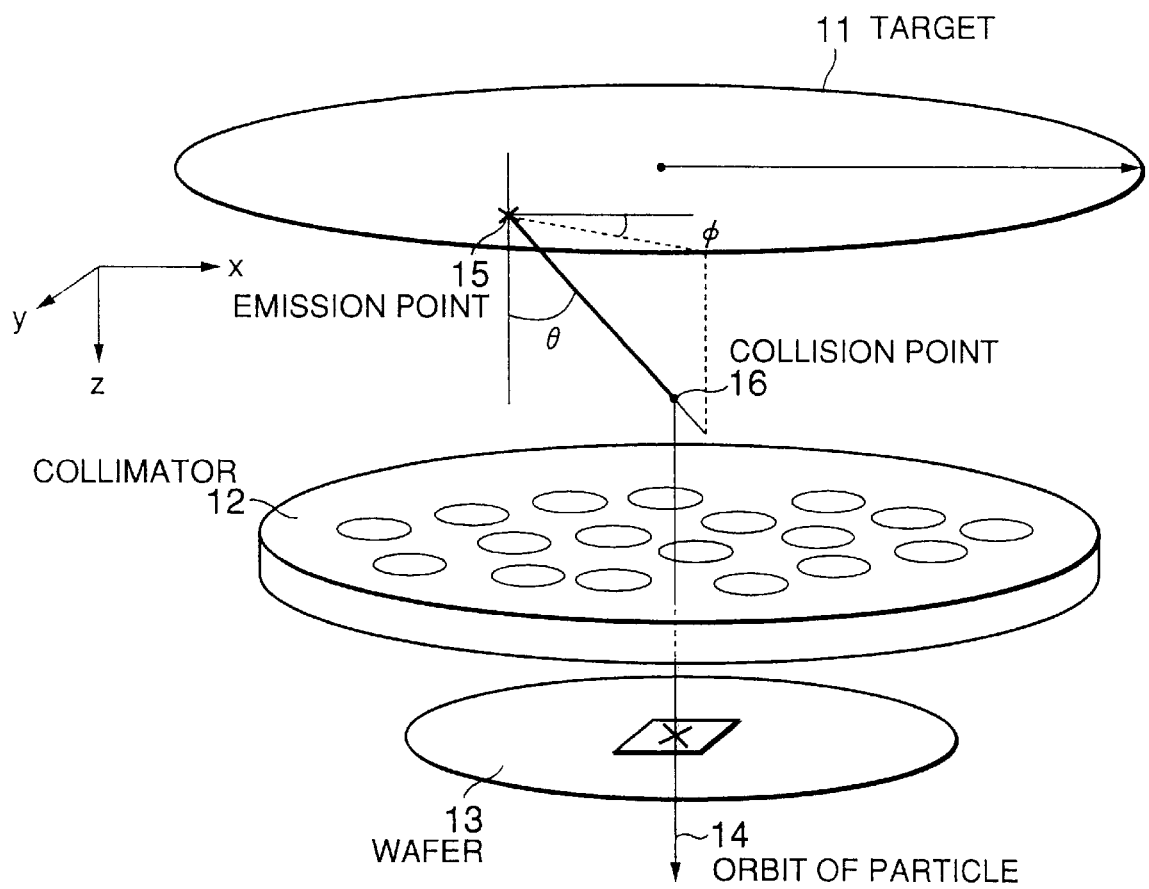
FIG. 1 is a view for describing a conventional simulation method.
Figure 2:
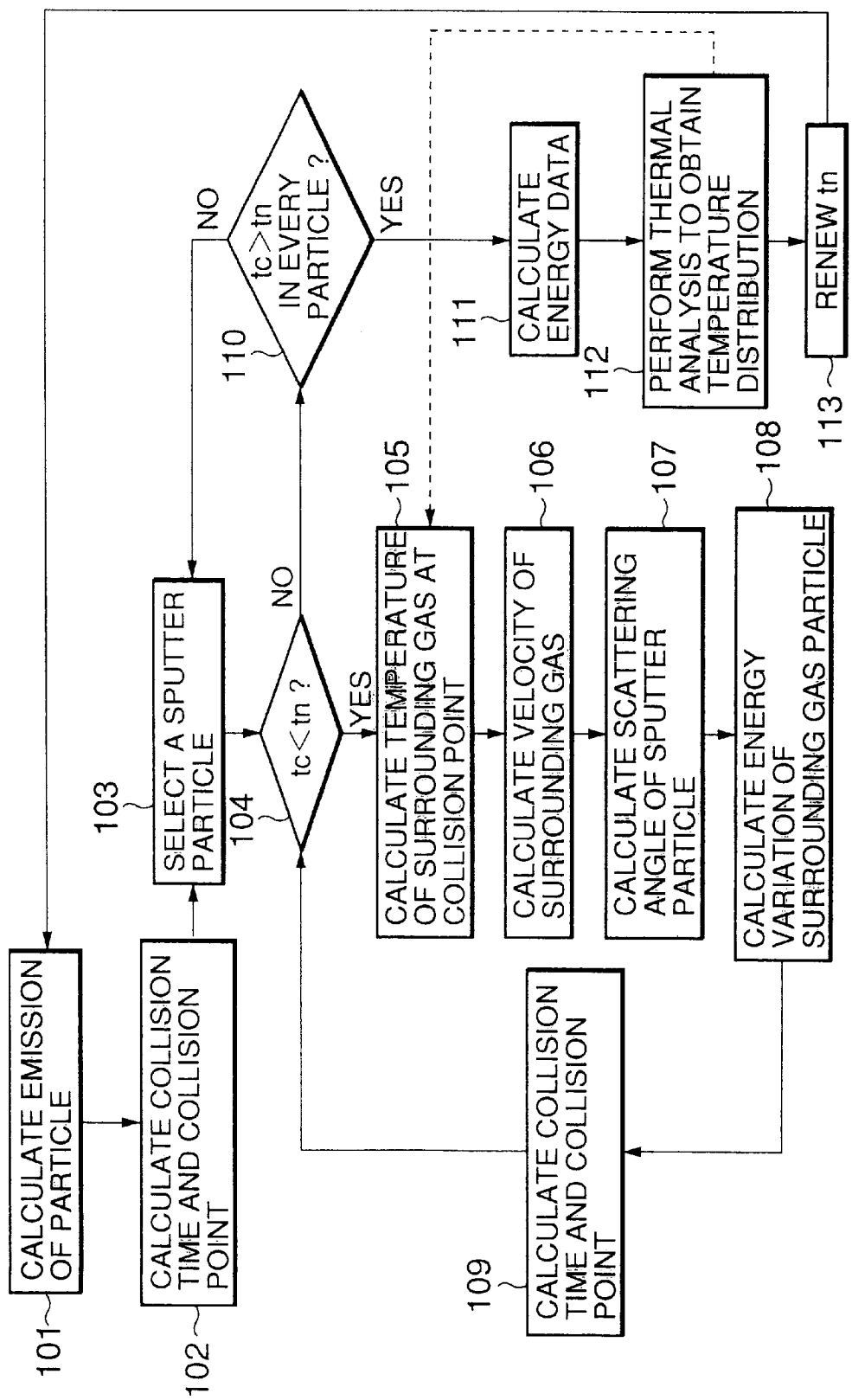
FIG. 2 is a flow chart for describing a simulation method according to an embodiment of the present invention.

Next, description will be made about a sputtering apparatus simulation method according to an embodiment of the present invention. Prior to calculation, the length of a unit time tn is determined as a reference time. Referring to FIG. 2, emission of a sputter particle from a target of the sputtering apparatus is calculated (step 101). Specifically, calculation is made of a generating position, an emission angle, and energy of each particle by the use of a random number in the manner similar to a conventional orbit calculation technique utilizing the Monte Carlo method. Let a flying distance which the particle travels before it collides with any surrounding gas particle of a surrounding gas be represented by dL. Assuming the Poisson distribution, the flying distance dL is calculated by:

$$dL = \lambda 0(vre1) \cdot \ln(e1), \quad (1)$$

where $\lambda 0(vre1)$ and e1 represents an average free path of each sputter particle and a random number, respectively. With reference to the flying distance, a collision point and a collision time to are calculated (step 102). Herein, the collision point represents a location where a collision takes place. The collision time represents a time period before the next collision takes place.

Subsequently, sputter particle data in the sputtering apparatus are extracted (step 103). The collision time tc of the sputter particle data is compared with the unit time tn (step 104). When tc<tn, collision calculation is performed. Upon collision calculation, a momentum of each particle is obtained in the following manner. Specifically, calculation is made of the temperature of the surrounding gas at the collision point with reference to a result of thermal analysis performed in a preceding unit time (step 105). Subsequently, the velocity of the surrounding gas particle is calculated by the use of the Maxwell distribution (step 106). Next, a scattering angle of sputter particle due to the collision is calculated by rigid-sphere approximation with reference to the result of calculation of elastic scattering in the central force field (step 107). In addition, energy variation of the surrounding gas particle is calculated (step 108). Next, in the manner similar to the step 102, the collision time tc and the collision point for the next collision are calculated (step 109). The collision time to of the particle data is compared with the unit time tn (step 104).

The above-mentioned steps 105–109 are repeated until the collision time tc exceeds the unit time tn. When tc≧tn as a result of the comparison in the step 104, judgment is made about whether or not the collision time tc exceeds the unit time tn for all sputter particles (step 110). If not, the steps 103–109 are repeated.

When the collision calculation has been completed for every sputter particle as far as the collision time tc is smaller than the unit time tn (yes in step 110), the value of the energy variation is calculated as energy data (step 111). Then, the thermal analysis is performed by the use of the energy data (step 112) to obtain the temperature distribution of the surrounding gas. Thereafter, the unit time is renewed (step 113). Then, the operation returns to the step 101 to repeat the above-mentioned calculation.

The temperature rise during the sputtering is on the order of 100° C. when the sputtering rate is high. As a result of the calculation in such a condition, the simulation error is as small as 5% or less in this embodiment while the simulation error is about 20% in the conventional simulation method. This embodiment requires the calculation period corresponding to about 1.5 times that of the conventional calculation method, which is sufficient for practical use.

Next, the description will be made about another embodiment of the present invention. Another embodiment is characterized by calculation of the collision point of the sputter particle and the surrounding gas particle. Specifically, the operation in the process proceeds in the manner similar to that illustrated in FIG. 2 except the steps 102 and 109 of calculating the collision time and the collision point are performed in a different manner as will presently be described.

At first, assuming that the velocity distribution of the surrounding gas particle is given by the Maxwell distribution at the highest temperature obtained in the preceding unit time, the flying distance dL is calculated by the Equation (1) by the use of the random number. Herein, the flying distance dL represents the distance which the sputter particle travel before it collides with any surrounding gas particle. From the flying distance dL, the collision point is obtained.

Subsequently, the temperature of the surrounding gas particle at the collision point thus obtained is calculated with reference to the result of the thermal analysis performed in the preceding unit time period. A collision probability Pi at the collision point is given by:

$$Pi = \exp(-dL/\lambda), \quad (2)$$

where $\lambda$ represents the average free path of the particle at the above-mentioned temperature.

Next, a random number e is generated and compared with the above-mentioned collision probability. When $2\lambda e > Pi$, it is judged that no collision will occur. Then, the collision calculation is again carried out. According to this embodiment, the collision point of the sputter particle can be obtained with a higher accuracy than that achieved by the preceding embodiment. Specifically, the accuracy can be improved by 2%.

As described above, according to this invention, the temperature rise during the sputtering is obtained by the thermal analysis and its influence upon the orbit of the sputter particle can be calculated. Therefore, the calculation can be made with a high accuracy as compared with the conventional Monte Carlo method, in particular, in case where the sputtering rate is high. It is thus possible to remarkably improve the simulation accuracy over various factors without substantial decrease in calculation speed.

What is claimed is:

1. A sputtering apparatus simulation method utilizing the Monte Carlo method comprises the steps of:

a first step of calculating a collision point and a collision time of collision between a sputter particle and a surrounding gas particle;

a second step of calculating, for each of all collision coordinates at which collision occurs within a unit time having a predetermined length, energy variation of the surrounding gas particle with reference to a temperature distribution of a surrounding gas at the collision point that is obtained by thermal analysis performed in a preceding unit time; and a third step of obtaining the temperature distribution of the surrounding gas at the collision point by thermal analysis using the result of calculation of the energy variation and thereafter renewing the unit time.

2. A sputtering apparatus simulation method as claimed in claim 1, wherein said first step of calculating said collision point and said collision time is carried out by calculating an emission point, an emission angle, and energy of said sputter particle by the use of a random number, and then calculating a flying distance which said sputter particle travels before it collides with any surrounding gas particle.

3. A sputtering apparatus simulation method as claimed in claim 1, wherein said second step includes comparing said collision time obtained in said first step with said unit time, calculating, when said collision time is smaller than said unit time, a temperature of a surrounding gas at said collision point with reference to the result of thermal analysis performed in said preceding unit time, calculating the velocity of said surrounding gas particle by the use of Maxwell distribution, calculating the energy variation of said surrounding gas particle resulting from the collision, and repeating the above-mentioned operations for all collision coordinates obtained in a predetermined unit time.

4. A sputtering apparatus simulation method as claimed in claim 1, wherein said first step includes calculation of a flying distance (dL) which said sputter particle travels before it collides with any surrounding gas particle, said flying distance being given by:

$$dL = \lambda 0(vre1) \cdot \ln(e1),$$

where $\lambda 0(vre1)$ and $e1$ represent an average free path of said sputter particle and a random number, respectively.

5. A sputtering apparatus simulation method as claimed in claim 1, said second step includes comparing said collision time obtained in said first step with said unit time, calculating, when said collision time is smaller than said unit time, a temperature of a surrounding gas at said collision point with reference to the result of thermal analysis performed in said preceding unit time, calculating a collision probability at said collision point, calculating the energy variation of said surrounding gas particle resulting from the collision, and repeating the above-mentioned operations for all collision coordinates obtained in a predetermined unit time.

6. A sputtering apparatus simulation method as claimed in claim 5, wherein said collision probability is given by:

$$\exp(-dL/\lambda),$$

where $\lambda$ represents the average free path of said sputter particle at the temperature calculated as mentioned above and dL represents a flying distance which said sputter particle travels before it collides with any surrounding gas particle.

7. A method of simulating operation of a sputtering apparatus, comprising the steps of:

a. calculating ejection positions and angles for ejected sputter particles from a target;

b. calculating collision coordinates and times of collisions of the ejected sputter particles with gas particles in a gas between the target and a surface onto which the ejected sputter particles are to be deposited;

c. at all of the collision coordinates of the ejected sputter particles having collision times within a unit time period, calculating energy variations of the gas particles by referring to a thermal distribution of the gas;

d. revising the thermal distribution of the gas based on the calculated energy variations; and e. restarting the unit time period and repeating steps a–d.

8. The method of claim 7, wherein step c. comprises the steps of calculating a temperature of the gas at the collision coordinates with reference to the thermal distribution from a preceding unit time period and calculating a velocity of the gas particles from the calculated temperature.

9. The method of claim 7, wherein step c. comprises the steps of calculating a temperature of the gas at the collision coordinates with reference to the thermal distribution from a preceding unit time period and calculating a probability of a collision at the calculated collision coordinate.

\* \* \* \* \*